(12) United States Patent
Choi et al.

(10) Patent No.: US 11,937,490 B2
(45) Date of Patent: Mar. 19, 2024

(54) DISPLAY DEVICE MANUFACTURING APPARATUS WITH ROTATOR AND DISPLAY DEVICE MANUFACTURING METHOD

(71) Applicant: SAMSUNG DISPLAY CO., LTD., Yongin-si (KR)

(72) Inventors: Myung Gil Choi, Yongin-si (KR); Jung Min Lee, Suwon-si (KR); Dong Woo Kim, Seoul (KR); Sang Moo Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/486,001

(22) Filed: Sep. 27, 2021

(65) Prior Publication Data

US 2022/0173364 A1    Jun. 2, 2022

(30) Foreign Application Priority Data

Dec. 1, 2020   (KR) ........................ 10-2020-0165319

(51) Int. Cl.
   *H10K 71/00*      (2023.01)
   *H05K 3/00*       (2006.01)

(52) U.S. Cl.
   CPC .......... *H10K 71/00* (2023.02); *H05K 3/0014* (2013.01); *H05K 2203/0165* (2013.01); *H05K 2203/302* (2013.01)

(58) Field of Classification Search
   CPC ... G02F 1/1303; G02F 1/13452; H05K 1/189; H05K 2201/10128
   See application file for complete search history.

(56) References Cited

U.S. PATENT DOCUMENTS

| 10,393,941 B2* | 8/2019 | Nichol ................ G02B 6/0028 |
| 2022/0173364 A1* | 6/2022 | Choi ..................... G02F 1/1303 |

FOREIGN PATENT DOCUMENTS

| KR | 10-2015-0114407 | 10/2015 |
| KR | 10-2017-0104102 | 9/2017 |
| KR | 10-2018-0011443 | 2/2018 |

* cited by examiner

*Primary Examiner* — Minh N Trinh
(74) *Attorney, Agent, or Firm* — F. CHAU & ASSOCIATES, LLC

(57) ABSTRACT

An apparatus for manufacturing a display device includes a plurality of working tables, a plurality of arm modules, and a rotator. The plurality of working tables are spaced apart from each other in a first direction and are configured to support a target board. The plurality of arm modules are arranged in the first direction and spaced apart from the plurality of working tables in a second direction intersecting the first direction. The rotator is connected to the plurality of arm modules and configured to rotate about a rotation axis extending in the first direction.

2 Claims, 12 Drawing Sheets

DISPLAY DEVICE MANUFACTURING APPARATUS WITH ROTATOR AND DISPLAY DEVICE MANUFACTURING METHOD

This application claims priority from Korean Patent Application No. 10-2020-0165319 filed on Dec. 1, 2020 in the Korean Intellectual Property Office, and all the benefits accruing therefrom under 35 U.S.C. 119, the contents of which are herein incorporated by reference in its entirety.

BACKGROUND

1. Field of the Disclosure

Embodiments described herein relate to an apparatus and method of manufacturing a display device.

2. Description of the Related Art

Many types of displays have been developed. Examples include liquid crystal displays, plasma display panels, and organic light emitting display devices. Some of these displays include a flexible printed circuit board coupled to a display panel. This arrangement allows one portion of the display panel to be bent to overlap another portion of the display panel in a thickness direction.

SUMMARY

Embodiments described provide an apparatus and method of manufacturing a display device which, for example, are capable of reducing process time and of improving equipment efficiency. It should be noted that features described herein are not limited to the above-described effects, and that these or others effects may be achieved as described in the following description.

In accordance with one or more embodiments, an apparatus to manufacture a display device includes a plurality of working tables spaced apart from each other in a first direction, the plurality of working tables configured to support a target board, a plurality of arms arranged in the first direction and spaced apart from the plurality of working tables in a second direction intersecting the first direction, and a rotator connected to the plurality of arms and configured to rotate about a rotation axis extending in the first direction.

In accordance with one or more embodiments, a method of manufacturing a display device comprising mounting at least one target board on a plurality of working tables, adsorbing the target board using a plurality of adsorbers, and rotating a rotator connected to the plurality of adsorbers to bend the target board.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components. In the figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, specific embodiments will be described with reference to the accompanying drawings.

Figure 1:
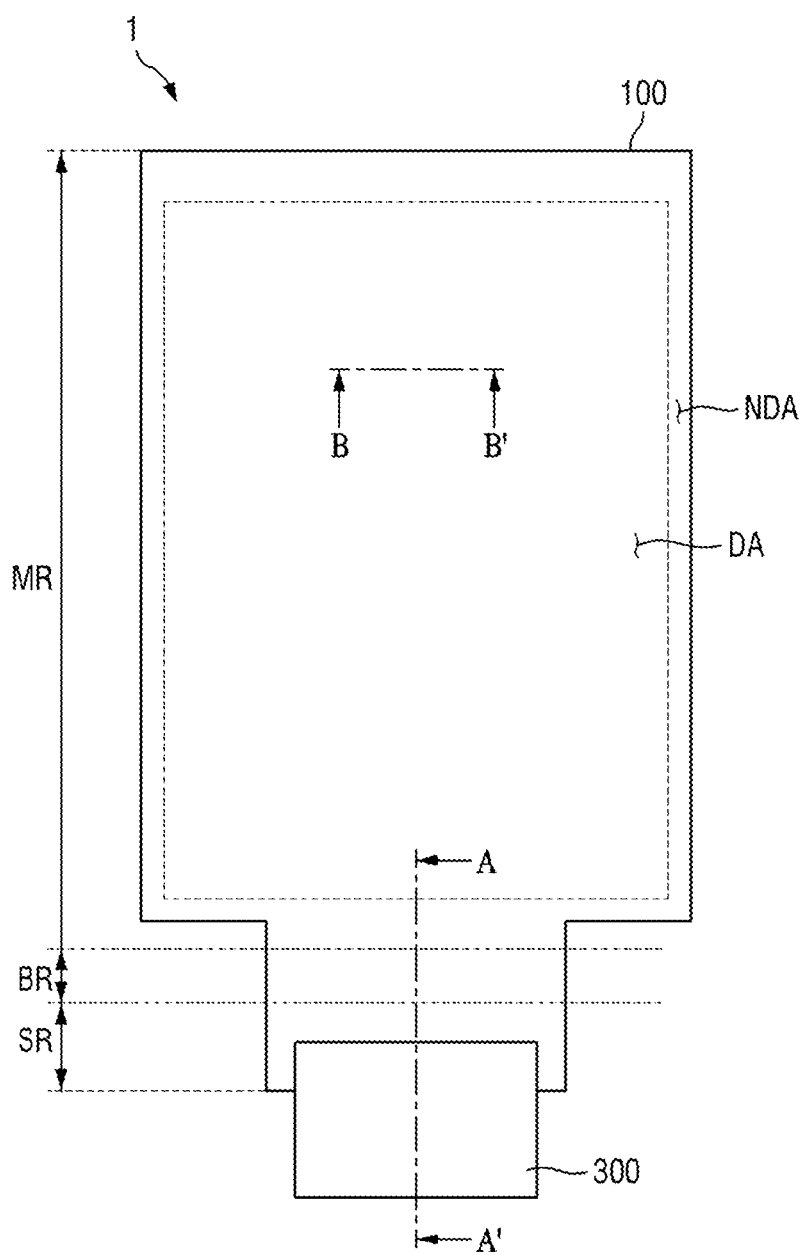
FIG. 1 illustrates an embodiment of a display device which may be manufactured by an apparatus according to an embodiment.
Figure 2:
FIG. 2 illustrates a cross-sectional view taken along line A-A' of FIG. 1.
Figure 3:
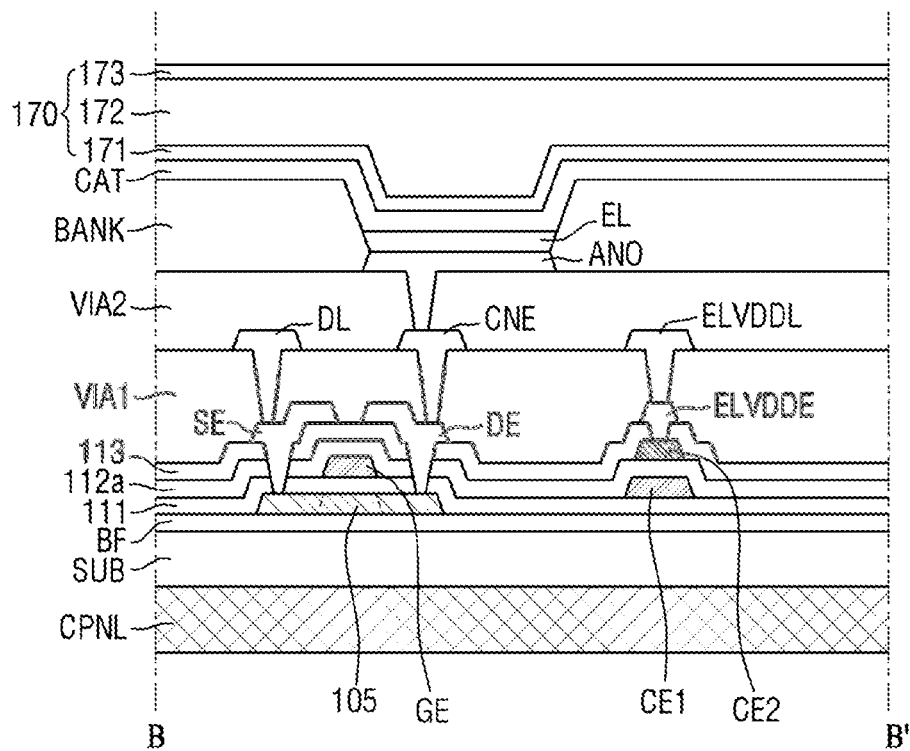
FIG. 3 illustrates a cross-sectional view taken along line B-B' of FIG. 1.

FIG. 1 is a plan view of a display device 1 which may be manufactured by an apparatus according to an embodiment. FIG. 2 is a cross-sectional view taken along line A-A' of FIG. 1, and FIG. 3 is a cross-sectional view taken along line B-B' of FIG. 1.

Referring to FIG. 1, the display device 1 may be any one of various devices that displays still images or video. The display device 1 may be included, for example, in a smartphone, a mobile phone, a tablet PC, a personal digital assistant (PDA), a portable multimedia player (PMP), a television, a game machine, a wrist watch type electronic device, a head mounted display, a monitor of a personal computer, a laptop computer, a car navigation, a car dashboard, a digital camera, a camcorder, an external billboard, an electronic sign, various medical devices, various inspection devices, various home appliances such as a refrigerator or a washing machine including a display unit, Internet of Things devices, or the like. However, the present disclosure is not limited thereto.

The display device 1 may be manufactured, for example, by various embodiments of a manufacturing apparatus (e.g., 10 in FIG. 4) and method as described herein. However, display device 1 may also be manufactured by apparatuses and methods which are different from the embodiments described herein.

Referring to FIGS. 1 and 2, the display device 1 may include a display panel 100 having a predetermined shape, e.g., a substantially rectangular shape when viewed on a plane. Corners of the display panel 100 may have one or more predetermined shapes, e.g., a pointed shape (e.g., in which adjacent sides are orthogonal to each other or jointed at another angle) on a plane. In one embodiment, one or more corners may be rounded. In one embodiment, the display panel 100 may have a shape corresponding to an L-shape when viewed on a plane. This shape may correspond, for example, to corners adjacent to a portion to which a printed circuit board (e.g., 300) is connected. However, other shapes are possible.

The display panel 100 is flexible and can be bent and, for example, may be an organic light emitting display panel. The display panel 100 may be a different type of display panel in another embodiment. Examples include a liquid crystal display (LCD), a quantum dot organic light emitting display panel (QD-OLED), a quantum dot liquid crystal display (QD-LCD), a quantum nano light emitting display panel (Nano NED), or a Micro LED.

The display panel 100 includes a display area DA and a non-display area NDA disposed around the display area DA. The display area DA includes a plurality of pixels to display still images or video and may have a predetermined shape, e.g., substantially rectangular shape, circular shape, elliptical shape or another shape when viewed on a plane.

The non-display area NDA may not display an image or a video and, for example, may correspond to a remaining area of the display device 1, except for the display area DA. The non-display area NDA may surround at least a portion of the display area DA. For example, as illustrated in FIG. 1, the non-display area NDA may be in a substantially band shape surrounding the display area DA on a plane. However, the present disclosure is not limited thereto, and the non-display area NDA may be adjacent to only both short sides or both long sides of the display area DA. When the display area is not rectangular, the non-display area NDA may be completely or partially surround one or more sides of the display area DA.

The display panel 100 may include a main region MR, a bending region BR, and a sub region SR. The main region MR may be a flat region including the display area DA and, for example, may have a substantially rectangular or other shape when viewed on a plane. The main region MR may include a portion of the non-display area NDA.

The bending region BR and the sub region SR may be in the non-display area NDA and may be on one or more sides of the main region MR. In one embodiment one side of the bending region BR may be connected to the one side of the main region MR. As illustrated in FIG. 1, the one side of the main region MR may be a lower side of the main region MR in a plan view. However, the present disclosure is not limited thereto.

The sub region SR may be on the other (or another) side of the bending region BR. One side of the sub region SR may be connected to the other (or another) side of the bending region BR. In one embodiment, the sub region SR may be connected to the main region MR by the bending region BR. As illustrated in FIG. 2, the bending region BR may be bent so that the sub region SR overlaps the main region MR in a thickness direction. In this case, printed circuit board 300, which is connected to the sub region SR, may also overlap the main region MR in the thickness direction.

The display device 1 may further include an adhesive member CM between the main region MR and the sub region SR. The main region MR and the sub region SR may be attached to each other by the adhesive member CM.

Referring to FIG. 3, the display panel 100 includes a substrate SUB, a plurality of conductive layers 120, 130, 140, and 150 on the substrate SUB, a plurality of insulating layers 111, 112, 113, VIA1, and VIA2 which insulate the conductive layers, and a light emitting layer EL. The substrate SUB may be over, on, or adjacent to the display area DA and the non-display area NDA. The substrate SUB may be a flexible substrate SUB including a flexible material, e.g., ductile glass, polyimide, and/or another material.

A buffer layer BFF may be on the substrate SUB to prevent moisture and oxygen from penetrating from the substrate SUB through other layers. The buffer layer BFF may include, for example, one of a silicon nitride ($SiN_x$) film, silicon oxide ($SiO_2$) film, or silicon oxynitride ($SiO_xN_y$) film.

The semiconductor layer 105 may be on the buffer layer BFF and, for example, may correspond to a channel of a thin film transistor. The semiconductor layer 105 may be in pixels of the display area DA, and in some cases may also be in the non-display area NDA. The semiconductor layer 105 may include, for example, polycrystalline silicon.

A first insulating layer 111 may be on the semiconductor layer 105 and on or over all or a portion of the substrate SUB. The first insulating layer 111 may serve, for example, as a gate insulating film having a gate insulating function. The first insulating layer 111 may include a silicon compound, a metal oxide, or another material. For example, the first insulating layer 111 may include silicon oxide, silicon nitride, silicon oxynitride, aluminum oxide, tantalum oxide, hafnium oxide, zirconium oxide, or titanium oxide used alone or in combination with each other or another material.

A first conductive layer 120 may be on the first insulating layer 111 and may include a gate electrode GE of a thin film transistor TFT and a first electrode CE1 of a storage capacitor. The first conductive layer 120 may include, for example, at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). The first conductive layer 120 may be, for example, a single film or a stacked film formed of one or more of the aforementioned materials.

A second insulating layer 112a may be on the first conductive layer 120 and may insulate the first conductive layer 120 and the second conductive layer 130. The second insulating layer 112a may include materials similar to those used, for example, for the first insulating layer 111.

The second conductive layer 130 may be on the second insulating layer 112a and may include a second electrode CE2 of the storage capacitor. The second conductive layer 130 may include materials similar to those of the first conductive layer 120. The storage capacitor may be formed by the first electrode CE1 and the second electrode CE2, with the second insulating layer 112a therebetween.

A third insulating layer 113 may be on the second conductive layer 130 and may include at least one of the materials of the first insulating layer 111, as described above. In one or more embodiments, the third insulating layer 113 may include an organic insulating material, which, for example, may correspond to one of those used for a first via layer VIA1 described below.

A third conductive layer 140 may be on the third insulating layer 113 and may include a source electrode SE, a drain electrode DE, a high potential voltage electrode ELVDDE, and a signal line PAD. The third conductive layer 140 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). In one embodiment, the third conductive layer 140 may be a single film formed of one or more of the aforementioned metals. In one embodiment, the third conductive layer 140 may include a stacked film. For example, the third conductive layer 140 may be formed in a stacked structure, such as but not limited to Ti/Al/Ti, Mo/Al/Mo, Mo/AlGe/Mo, and Ti/Cu. In one embodiment, the third conductive layer 140 may include Ti/Al/Ti.

The first via layer VIA1 may be on the third conductive layer 140 and may include an organic insulating material. The organic insulating material may include at least one of an acrylic resin, an epoxy resin, a phenolic resin, a polyamide resin, a polyimide resin, an unsaturated polyester resin, a poly phenylene ether resin, a polyphenylene sulfide resin, or benzocyclobutene (BCB).

A fourth conductive layer 150 may be on the first via layer VIA1 and may include a data line DL, a connection electrode CNE, and a high potential voltage line ELVDDL. The data line DL may be electrically connected to the source electrode SE of the thin film transistor TFT through a contact hole penetrating the first via layer VIA1. The connection electrode CNE may be electrically connected to the drain electrode DE of the thin film transistor TFT through a contact hole penetrating the first via layer VIA1. The high potential voltage line ELVDDL may be electrically connected to the high potential voltage electrode ELVDDE through a contact hole penetrating the first via layer VIA1. The fourth conductive layer 150 may include a material corresponding to those of the third conductive layer 140.

A second via layer VIA2 may be on the fourth conductive layer 150 and may include at least one of the materials of the first via layer VIA1 described above.

An anode ANO may be on the second via layer VIA2 and electrically connected to the connection electrode CNE through a contact hole penetrating the second via layer VIA2.

A bank layer BANK may be on the anode ANO and may include a contact hole which exposes the anode ANO. The bank layer BANK may include an organic insulating material or an inorganic insulating material. For example, the bank layer BANK may be formed to include at least one of a photoresist, a polyimide resin, an acrylic resin, a silicone compound, or a polyacrylic resin.

The light emitting layer EL may be on an upper surface of the anode ANO and in an opening OP of the bank layer BANK. A cathode CAT is on the light emitting layer EL and the bank layer BANK and may be a common electrode disposed over a plurality of pixels.

A thin film encapsulation layer TFE may be on the cathode CAT and may cover an organic light emitting device OLED. In one embodiment, the thin film encapsulation layer TFE may be a stacked film in which an inorganic film and an organic film are alternately stacked. For example, the thin film encapsulation layer TFE may include a first encapsulation inorganic film 171, an encapsulation organic film 172, and a second encapsulation inorganic film 173 which are sequentially stacked.

The display panel 100 may include a panel lower sheet CPNL on a lower surface of the substrate SUB. For example, the panel lower sheet CPNL may include at least one functional layer such as a digitizer, a heat dissipation member, a shield member, and a buffer member.

Referring again to FIGS. 1 and 2, the display device 1 may further include the printed circuit board 300. One side of the printed circuit board 300 may be attached to the other side of the sub region SR. The printed circuit board 300 may be a flexible circuit board. The display device 1 may further include a main circuit board attached to the other side of the printed circuit board 300.

The display device 1 may further include a driving member 200 which drives the plurality of pixels in the display area DA. The driving member 200 may include a display driving integrated circuit. The driving member 200 may be mounted on the sub region SR between the bending region BR of the display panel 100 and the flexible circuit board on a plan view or may be mounted on the printed circuit board 300. The driving member 200 may be attached to the display panel 100 in a chip on plastic (COP) method, a chip on glass (COG) method, or a chip on film (COF) method.

As described above, the bending region BR of the display panel 100 may be bent so that the sub region SR overlaps the main region MR in the thickness direction. This bending may be performed by the display device manufacturing apparatus (e.g., 10 in FIG. 4) and the display device manufacturing method to be described later.

Figure 4:
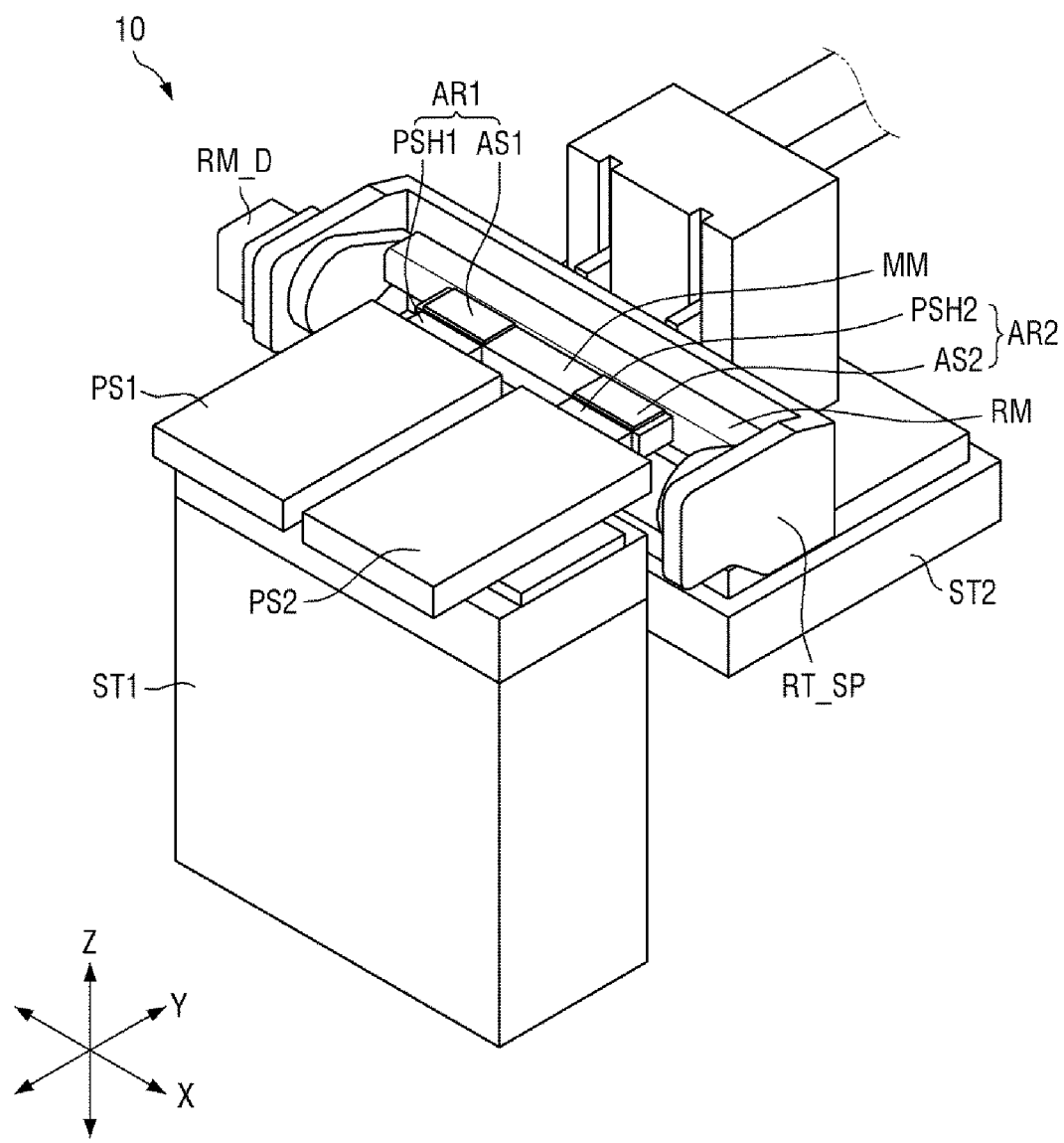
FIG. 4 illustrates an embodiment of an apparatus for manufacturing a display device.
Figure 5:
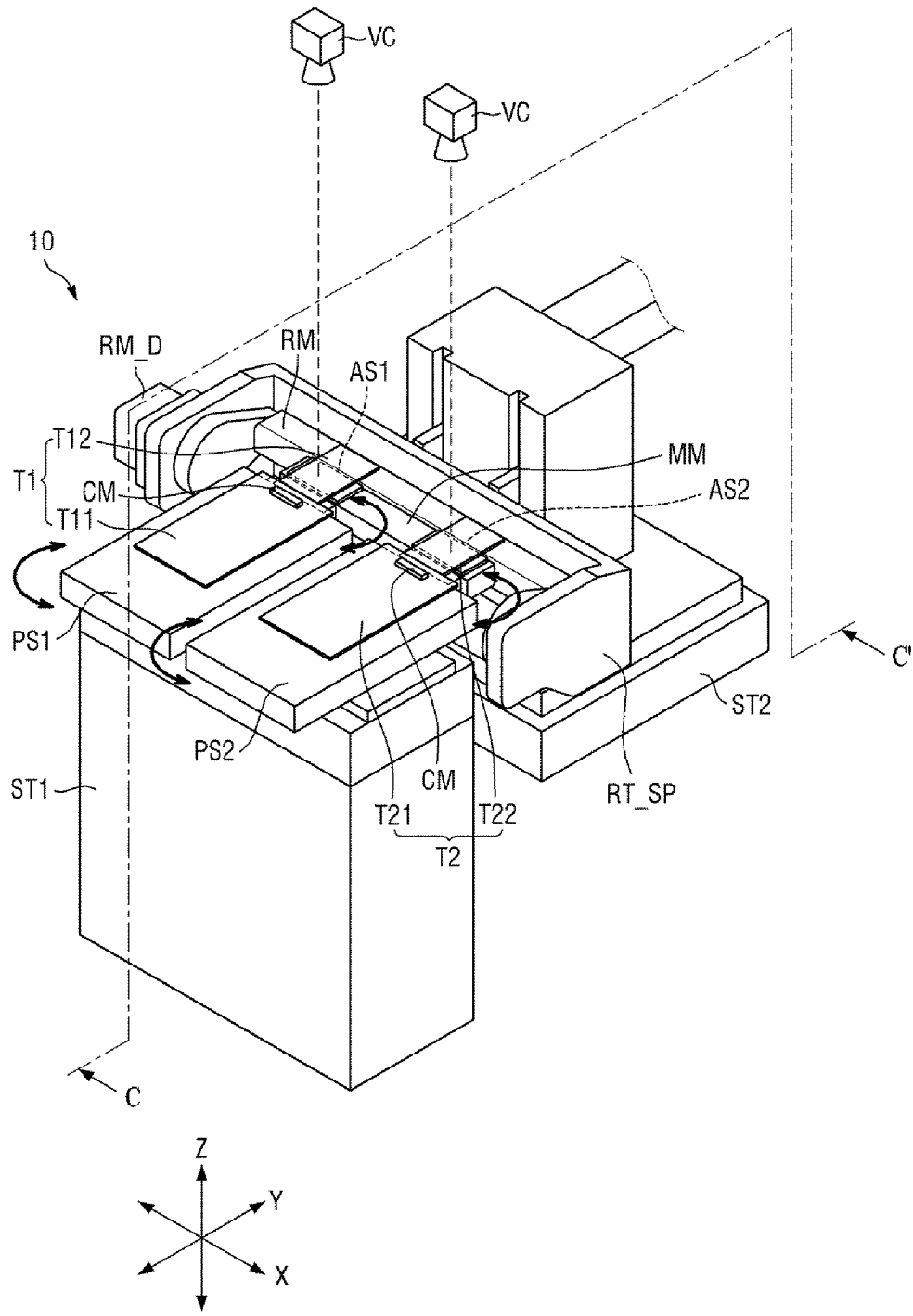
FIG. 5 illustrates a perspective view of the manufacturing apparatus in a state in which a target board is mounted according to an embodiment.
Figure 6:
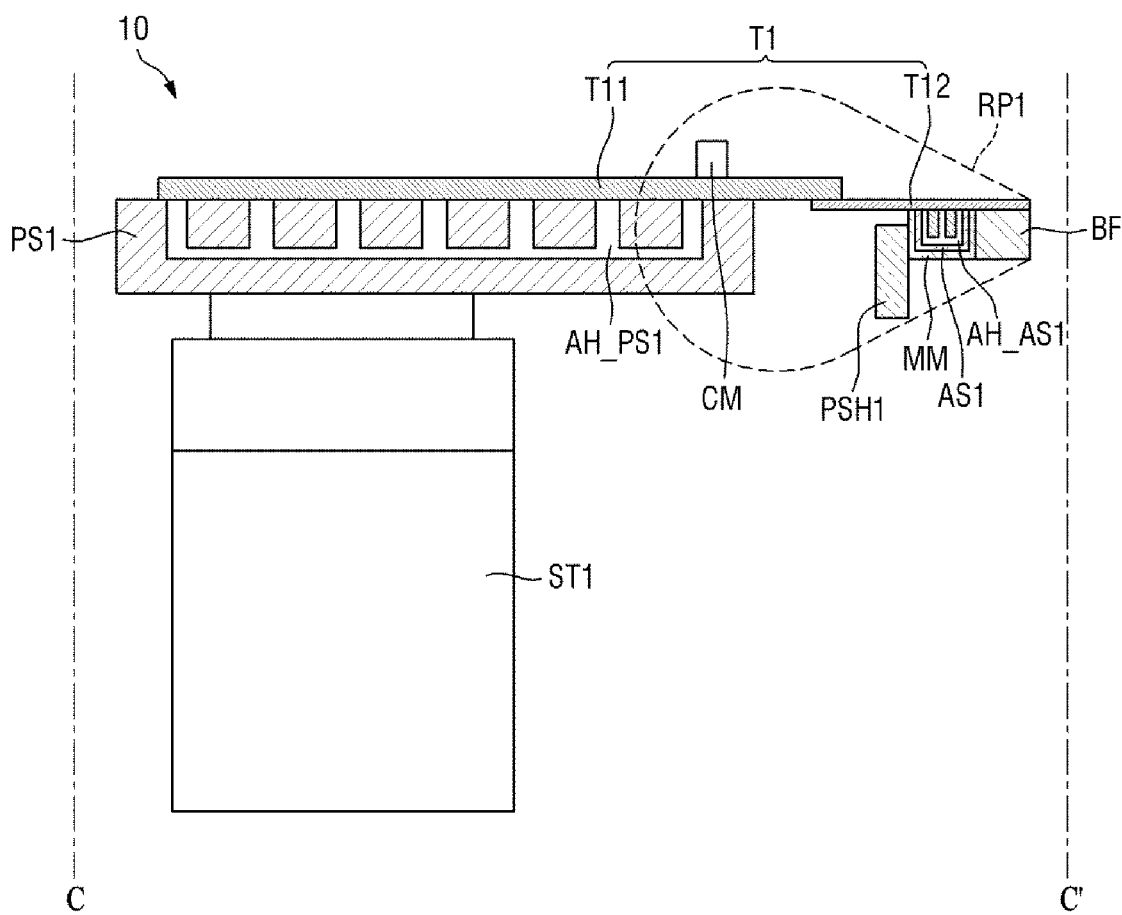
FIG. 6 illustrates a cross-sectional view taken along line C-C' of FIG. 5.
Figure 7:
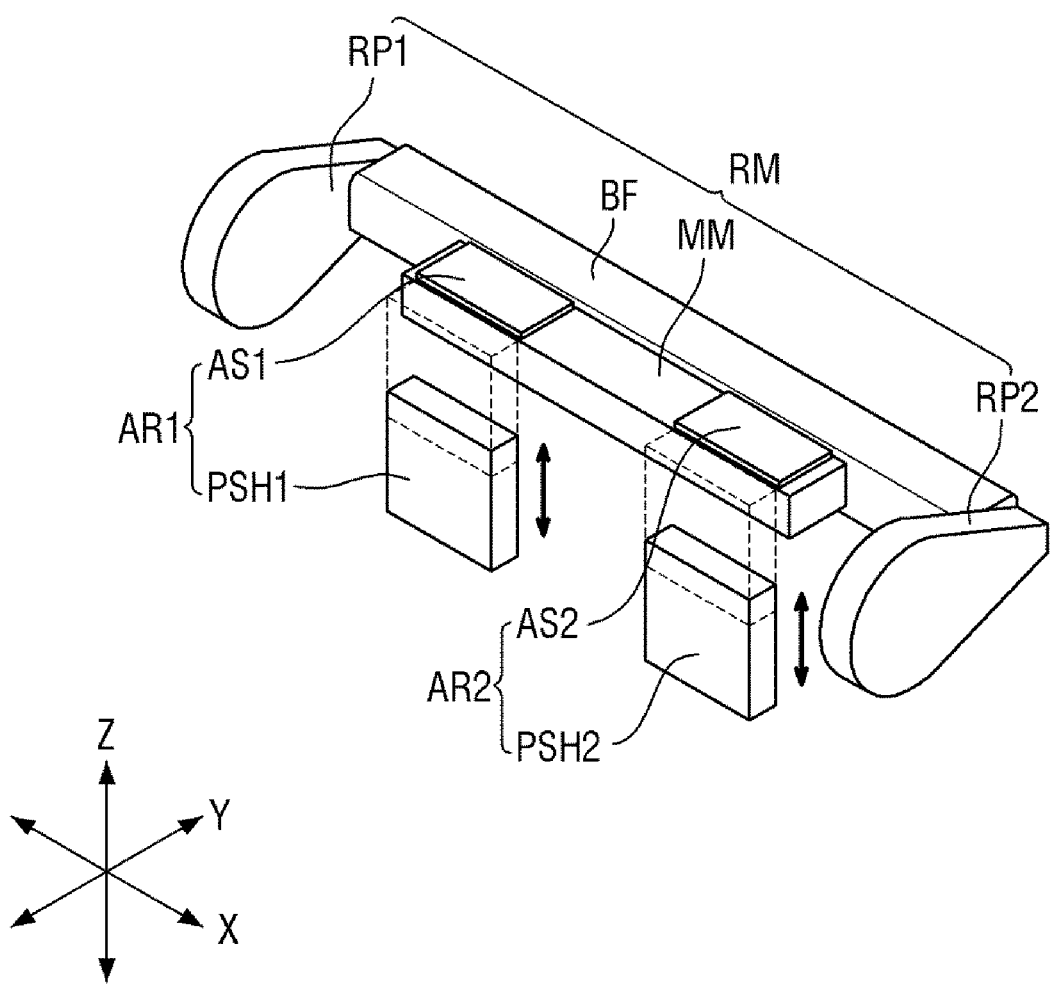
FIG. 7 illustrates an embodiment of a rotating member, a first arm module, and a second arm module according to an embodiment.

FIG. 4 is a perspective view of an embodiment of an apparatus 10 for manufacturing a display device. FIG. 5 is a perspective view of embodiment of the apparatus 10 in a state in which a target board is mounted. FIG. 6 is a cross-sectional view taken along line C-C' of FIG. 5. FIG. 7 is a perspective view of an embodiment which includes a rotating member (or rotator), a first arm module, and a second arm module.

In these figures, a first direction X, a second direction Y, and a third direction Z intersect in different directions. In one embodiment, the first direction X, the second direction Y, and the third direction Z may intersect each other perpendicularly. The first direction X may be a horizontal direction, the second direction Y may be a vertical direction, and the third direction Z may be a thickness direction. The first direction X, the second direction Y, and/or the third direction Z may include two or more directions. For example, the third direction Z may include an upward direction toward an upper side of the drawing and a downward direction toward a lower side of the drawing. In this case, one surface of a member facing upward may be referred to as an upper surface, and the other surface of the member facing downward may be referred to as a lower surface. However, the directions are illustrative and relative, and are not limited to those mentioned above.

Referring to FIGS. 4 to 6, the apparatus 10 of manufacturing a display device may include a first working table PS1, a second working table PS2, a rotating member (or rotator) RM, a first arm module AR1, and a second arm module AR2. Each of the first working table PS1 and the second working table PS2 may have a predetermined shape, e.g., an approximately rectangular shape including short sides in the first direction X and long sides in the second direction Y on a plane. The tables may have a different shape in another embodiment.

The first working table PS1 and the second working table PS2 may be arranged in the first direction X. The first working table PS1 and the second working table PS2 may be spaced apart from each other in the first direction X on a first stage ST1 to be described later. The first working table PS1 and the second working table PS2 may be connected to each other by the first stage ST1. In one embodiment, the first working table PS1 and the second working table PS2 may be disposed so that respective long sides thereof face each other. However, the present disclosure is not limited thereto.

Each of the first working table PS1 and the second working table PS2 may be configured to be movable and/or rotatable in at least one direction. In one embodiment, each of the first working table PS1 and the second working table PS2 is movable in the first direction X, the second direction Y, and the third direction Z and rotatable about a rotation axis extending in the third direction Z. However, the present disclosure is not limited thereto.

Each of the first working table PS1 and the second working table PS2 may include at least one servo motor which provides power for movement and/or rotation thereof. Each of the first working table PS1 and the second working table PS2 may include a linear stage and/or a UVW stage. In one embodiment, the first working table PS1 and the second working table PS2 may be provided as separate stages, which may have a size smaller than that of the first stage ST1 and may be disposed above the first stage ST1 so that the target board is directly mounted.

The display device 1 may further include the first stage ST1 which supports the first working table PS1 and the second working table PS2. The first stage ST1 may be disposed below the first working table PS1 and the second working table PS2. The first working table PS1 and the second working table PS2 may be mounted on the first stage ST1. The first stage ST1 may be connected to the first working table PS1 and the second working table PS2 and may move and/or rotate the first working table PS1 and the second working table PS2 in at least one direction. As described later, the first stage ST1 may integrally move and/or rotate the first working table PS1 and the second working table PS2.

In one embodiment, the first stage ST1 may move the first working table PS1 and the second working table PS2 in at least one direction of the first direction X, the second direction Y, and the third direction Z and rotate the first working table PS1 and the second working table PS2 about an arbitrary axis extending in the third direction Z. However, the present disclosure is not limited thereto. A driver which provides power for moving and/or rotating the first stage ST1 may be mounted on the first stage ST1. The first stage ST1 may include a linear stage and/or a UVW stage.

The rotating member (or rotator) RM may be on one side of the first working table PS1 and the second working table PS2 and may extend in the first direction X. The rotating member RM may be disposed along one short side of the first working table PS1 in the first direction X and one short side of the second working table PS2 in the first direction X. The length of the rotating member RM in the first direction X may be greater than the sum of a length of the one short side of the first working table PS1 and a length of the one short side of the second working table PS2. The rotating member RM may be configured to be rotatable about an arbitrary axis in the second direction Y.

The display device manufacturing apparatus 10 may further include a rotating member support portion RT_SP, a rotation driver RM_D, and a second stage ST2. The rotating member support portion RT_SP may support the rotating member RM so that the rotating member RM is positioned at a predetermined position with respect to the first working table PS1 and the second working table PS2. The rotating member support portion RT_SP may be connected to respective sides of the rotating member RM. Each of respective sides of the rotating member RM may be rotatably connected to the rotating member support portion RT_SP. The rotating member support portion RT_SP may connect the rotating member RM and the second stage ST2. In one embodiment, the rotating member support portion RT_SP may be a frame having a "U" shape surrounding a portion of the rotating member RM, but may have a different shape in another embodiment.

The rotation driver RM_D may be connected to at least one of two sides of the rotating member RM. The rotation driver RM_D may provide power for rotation of the rotating member RM.

The first arm module AR1 and the second arm module AR2 may be connected to the rotating member RM. While the first arm module AR1 and the second arm module AR2 may be connected to a middle of the rotating member RM extending in the first direction X, the first arm module AR1 and the second arm module AR2 may be disposed at positions corresponding to the first working table PS1 and the second working table PS2, respectively.

As illustrated in FIG. 4, while the first arm module AR1 and the second arm module AR2 are arranged in the first direction X, the first arm module AR1 may be between the rotating member RM and the first working table PS1 and the second arm module AR2 may be between the rotating member RM and the second working table PS2. In this case, the first working table PS1 and the first arm module AR1 may be arranged in the second direction Y, and the second working table PS2 and the second arm module AR2 may also be arranged in the second direction Y, on a plane. When the rotating member RM is rotated, the first arm module AR1 and second arm module AR2 may rotate together with rotating member RM.

The display device manufacturing apparatus 10 may further include the second stage ST2, which may be connected to the rotating member support portion RT_SP and which may move and/or rotate the rotating member support portion RT_SP in at least one direction. The second stage ST2 may move and/or rotate the rotating member support portion RT_SP so that the rotating member RM and rotating member support portion RT_SP integrally move and/or rotate.

In one embodiment, the second stage ST2 may move the rotating member support part RT_SP in the first direction X, the second direction Y, and the third direction Z, and rotate the rotating member support portion RT_SP about an arbitrary axis extending in the third direction Z. However, the present disclosure is not limited thereto.

A driver which provides power for moving and/or rotating the second stage ST2 may be mounted on the second stage ST2. The second stage ST2 may include a linear stage and/or a UVW stage.

As illustrated in FIG. 5, a first target board T1 and a second target board T2 may be mounted on the display device manufacturing apparatus 10. The first target board T1 may include a first base board T11 and a first flexible circuit board T12 connected to the first base board T11. The second target board T2 may include a second base board T21 and a second flexible circuit board T22 connected to the second base board T21.

Each of the first base board T11 and the second base board T21 may be the flexible display panel 100 or the substrate SUB of flexible display panel 100, and the first flexible circuit board T12 and the second flexible circuit board T22 may be the printed circuit board 300 connected to the flexible display panel 100. For example, the first base board T11 and the second base board T21 may be the board of FIGS. 1 to 3, and the first flexible circuit board T12 and the second flexible circuit board T22 may be the printed circuit board 300 of FIGS. 1 to 3. In this case, the first target board T1 and the second target board T2 may be inverted and mounted so that the display area DA faces the first working table PS1 or the second working table PS2. However, the first target board T1 and the second target board T2 are not limited to the display panel 100 and the printed circuit board 300 of FIGS. 1 to 3.

The first base board T11 and the second base board T21 may be mounted on the first working table PS1 and the second working table PS2, respectively. For example, the first working table PS1 and the second working table PS2 may include a position fixing unit such as an electrostatic chuck, an adhesive chuck, and a vacuum chuck, and thus, a relative position of the first base board T11 or the second base board T21 with respect to the first working table PS1 or the second working table PS2 may be fixed by the position fixing unit.

In one embodiment, as illustrated in FIG. 6, the first working table PS1 may include at least one air hole AH_PS1 in which a negative pressure is provided, one-side opening of the air hole AH_PS1 may be disposed on the upper surface of the first working table PS1, and thus the first base board T11 may be adsorbed and fixed to the first working table PS1. The second working table PS2 may also include an air hole substantially the same as or similar to the air hole AH_PS1 of the first working table PS1.

As illustrated in FIGS. 5 and 6, the first flexible circuit board T12 may be disposed on the first arm module AR1 and the rotating member RM, and the second flexible circuit board T22 may be disposed on the second arm module AR2 and the rotating member RM. The first flexible circuit board T12 may overlap a first adsorber AS1 and a first pusher PSH1 in the thickness direction, and the second flexible circuit board T22 may overlap a second adsorber AS2 and a second pusher PSH2 in the thickness direction.

The first arm module AR1, the second arm module AR2, and/or a module mounter MM are spaced apart from the printed circuit board 300, and then may come into close contact (e.g., to within a predetermined distance) with the first flexible circuit board T12 or the second flexible circuit board T22 after the alignment of the first target board T1 and the second target board T2 is completed. However, the present disclosure is not limited thereto. For example, the first flexible circuit board T12 and the second flexible circuit board T22 may be disposed only on the first arm module AR1 and the second arm module AR2, respectively, and the first arm module AR1 and the second arm module AR2 may be in close contact (e.g., to within a predetermined distance) with the first flexible circuit board T12 or the second flexible circuit board T22 even before the first target board T1 and the second target board T2 are aligned.

One side of the first flexible circuit board T12 may be connected to one side of the first base board T11 between the first working table PS1 and the rotating member RM. The other side of the first flexible circuit board T12 may be disposed on the rotating member RM. One side and the other side of the second flexible circuit board T22 may also be disposed in a manner substantially the same as or similar to the first flexible circuit board T12.

As illustrated in FIG. 5, the first working table PS1 and the second working table PS2 may perform an alignment operation of moving and/or rotating in at least one direction. For example, the alignment operation may be performed before or after the first target board T1 and the second target board T2 are mounted and/or before and after the first target board T1 and the second target board T2 are bent. By the alignment operation, the first target board T1 and the second target board T2 may be aligned to positions suitable for bending and/or pressing. The display device manufacturing apparatus 10 may further include a controller which controls the alignment operation.

The display device manufacturing apparatus 10 may further include at least one detector VC disposed above the first working table PS1 and/or the second working table PS2. The alignment operation may be performed based on at least position information of the first target board T1 and the second target board T2 obtained by the detector VC.

The first working table PS1 and the second working table PS2 may perform the alignment operation independently of each other. For example, the first working table PS1 and the second working table PS2 may individually perform the alignment operation. When the alignment operation is performed, the movement direction and/or rotation direction of the first working table PS1 may be different from the movement direction and/or rotation direction of the second working table PS2. In this case, the movement distance and/or rotation angle of the first working table PS1 may be substantially the same as or different from a movement distance and/or a rotation angle of the second working table PS2. In one embodiment, when the alignment operation is performed, the movement direction and/or the rotation direction of the first working table PS1 may be substantially the same as the movement direction and/or the rotation direction of the second working table PS2. The movement distance and/or the rotation angle of the first working table PS1 may be different from the movement distance and/or the rotation angle of the second working table PS2.

For example, the first working table PS1 may move in the first direction X based on the position information of the first target board T1, and the second working table PS2 may move in the second direction Y different from the first direction X based on the position information of the second target board T2. In one example, the first working table PS1 may rotate clockwise about an axis of the third direction Z based on the position information of the first target board T1, and the second working table PS2 may rotate counterclockwise about an axis of the third direction Z based on the position information of the second target board T2. The movement and rotation as described above may be performed at substantially the same time. However, the present disclosure is not limited thereto.

Before and after the first target board T1 and the second target board T2 are mounted and/or before and after the first target board T1 and the second target board T2 are bent, the first stage ST1 and/or the second stage ST2 may perform an alignment operation of moving and/or rotating in at least one direction. Similar to the first working table PS1 and the second working table PS2, the movement and/or rotation of the first stage ST1 and the second stage ST2 may be performed independently of each other.

In one embodiment, only the first working table PS1 and the second working table PS2 may perform the alignment operation before and after the first target board T1 and the second target board T2 are mounted and/or before and after the first target board T1 and the second target board T2 are bent. However, the present disclosure is not limited thereto.

The alignment operation of the first stage ST1 or the second stage ST2 may be performed at substantially the same time as the alignment operation of the first working table PS1 or the second working table PS2, and only the alignment operation of the first stage ST1 and/or the second stage ST2 may be performed.

Referring further to FIG. 7, the rotating member RM may include a first rotation plate RP1, a second rotation plate RP2, a connection frame BF, and the module mounter MM. The first rotation plate RP1 and the second rotation plate RP2 may be arranged in the first direction X. The first arm module AR1 and the second arm module AR2 may be between the first rotation plate RP1 and the second rotation plate RP2. Each of the first rotation plate RP1 and the second rotation plate RP2 may be formed, for example, of a plate-shaped member and may have a cross section of an approximately circular shape, water droplet shape, or elliptical shape. However, the present disclosure is not limited thereto.

The connection frame BF may be constituted by a rod-shaped member extending in the first direction X. The connection frame BF may have one side connected to the first rotation plate RP1 and another side connected to the second rotation plate.

The module mounter MM may be between the first rotation plate RP1 and the second rotation plate RP2. The module mounter MM may be on one side of the connection frame BF facing the first working table PS1 and the second working table PS2. The module mounter MM may extend along one side of the connection frame BF extending in the first direction X. The module mounter MM may mount the first arm module AR1 and the second arm module AR2.

The first arm module AR1 may include a first adsorber AS1, and the second arm module AR2 may include a second adsorber AS2. The first arm module AR1 may further include a first pusher PSH1, and the second arm module AR2 may further include a second pusher PSH2. The first adsorber AS1 and the second adsorber AS2 may be spaced apart from each other on the module mounter MM and may be arranged in the first direction X. As illustrated in FIGS. 5 and 6, the first flexible circuit board T12 and the second flexible circuit board T22 may be mounted on the first adsorber AS1 and the second adsorber AS2, respectively.

The first adsorber AS1 and the second adsorber AS2 may include a position fixing unit such as an electrostatic chuck, an adhesive chuck, and a vacuum chuck. Thus, a relative position of the first flexible circuit board T12 or the second flexible circuit board T22 with respect to the first adsorber AS1 or the second adsorber AS2 may be fixed by the position fixing unit. In one embodiment, positioning of the first flexible circuit board T12 and the second flexible circuit board T22 by the first adsorber AS1 and the second adsorber AS2 may be performed after the first target board T1 and the second target board T2 are aligned.

The first adsorber AS1 and the second adsorber AS2 may be controlled at substantially the same time or individually. For example, depending on process conditions, the first adsorber AS1 and the second adsorber AS2 may be driven interdependently or independently of each other. For example, the first adsorber AS1 and the second adsorber AS2 may adsorb the first flexible circuit board T12 or the second flexible circuit board T22 at substantially the same time, or may adsorb the first flexible circuit board T12 or the second flexible circuit board T22 with a time difference. In one example, an adsorption force of the first adsorber AS1 and an adsorption force of the second adsorber AS2 may be adjusted equally or differently from each other.

In one embodiment, as illustrated in FIG. 6, the first adsorber AS1 may include an air hole AH_AS1 for adsorbing the first flexible circuit board T12 mounted on the first adsorber AS1. The second adsorber AS2 may also include an air hole substantially the same as or similar to the air hole AH_AS1 of the first adsorber AS1.

The first pusher PSH1 and the second pusher PSH2 may be on one side of the module mounter MM and/or the rotating member RM facing the first working table PS1 and the second working table PS2. The first pusher PSH1 and the second pusher PSH2 may be connected to the rotating member RM by the module mounter MM.

As illustrated in FIGS. 4 and 6, the first pusher PSH1 may be between the first adsorber AS1 and the first working table PS1, and the second pusher PSH2 may be between the second adsorber AS2 and the second working table PS2. The first pusher PSH1 and the first adsorber AS1 may be arranged in the second direction Y, and the second pusher PSH2 and the second adsorber AS2 may be arranged in the second direction Y.

In one embodiment, as illustrated in FIG. 7, the first pusher PSH1 and the second pusher PSH2 may be configured to be movable in the third direction Z. For example, the third direction Z may include a vertical direction. In one example, the third direction Z may include one direction and the other direction opposite to the one direction. The one direction and the other side direction may be closer to the first flexible circuit board T12 or the second flexible circuit board T22 and away from the first flexible circuit board T12 or the second flexible circuit board T22, respectively.

When the first base board T11 and the second base board T21 are bent, the first pusher PSH1 and the second pusher PSH2 press the first flexible circuit board T12 and the second flexible circuit board T22, respectively, and thus the first target board T1 and the second target board T2 can be prevented from being warped. The first pusher PSH1 and the second pusher PSH2 may include at least one air hole for adsorbing the first flexible circuit board T12 or the second flexible circuit board T22.

As illustrated in FIGS. 4 and 6, before rotation of the rotating member RM for bending the first target board T1, the first working table PS1, the first pusher PSH1 and the first adsorber AS1 may be sequentially arranged in the second direction Y. The second working table PS2, the second pusher PSH2, and the second adsorber AS2 may also be sequentially arranged in the second direction Y. In this case, the first adsorber AS1, the module mounter MM, and the first pusher PSH1 may be between the connection frame BF and the first working table PS1, and the second adsorber AS2, the module mounter MM, and the second pusher PSH2 may be between the connection frame BF and the second working table PS2.

The first working table PS1 may support a lower surface of the first base board T11, and the connection frame BF, the first arm module AR1, and the module mounter MM may support a lower surface of the first flexible circuit board T12. The second base board T21 and the second flexible circuit board T22 may also be supported by the second working table PS2, the connection frame BF, the second arm module AR2, and the module mounter MM in a manner substantially the same as or similar to the first base board T11 and the first flexible circuit board T12.

Before the first target board T1 and the second target board T2 are bent, the first pusher PSH1 and the second pusher PSH2 may be spaced apart from the first target board T1 or the second target board T2. However, the present disclosure is not limited thereto.

Figure 8:
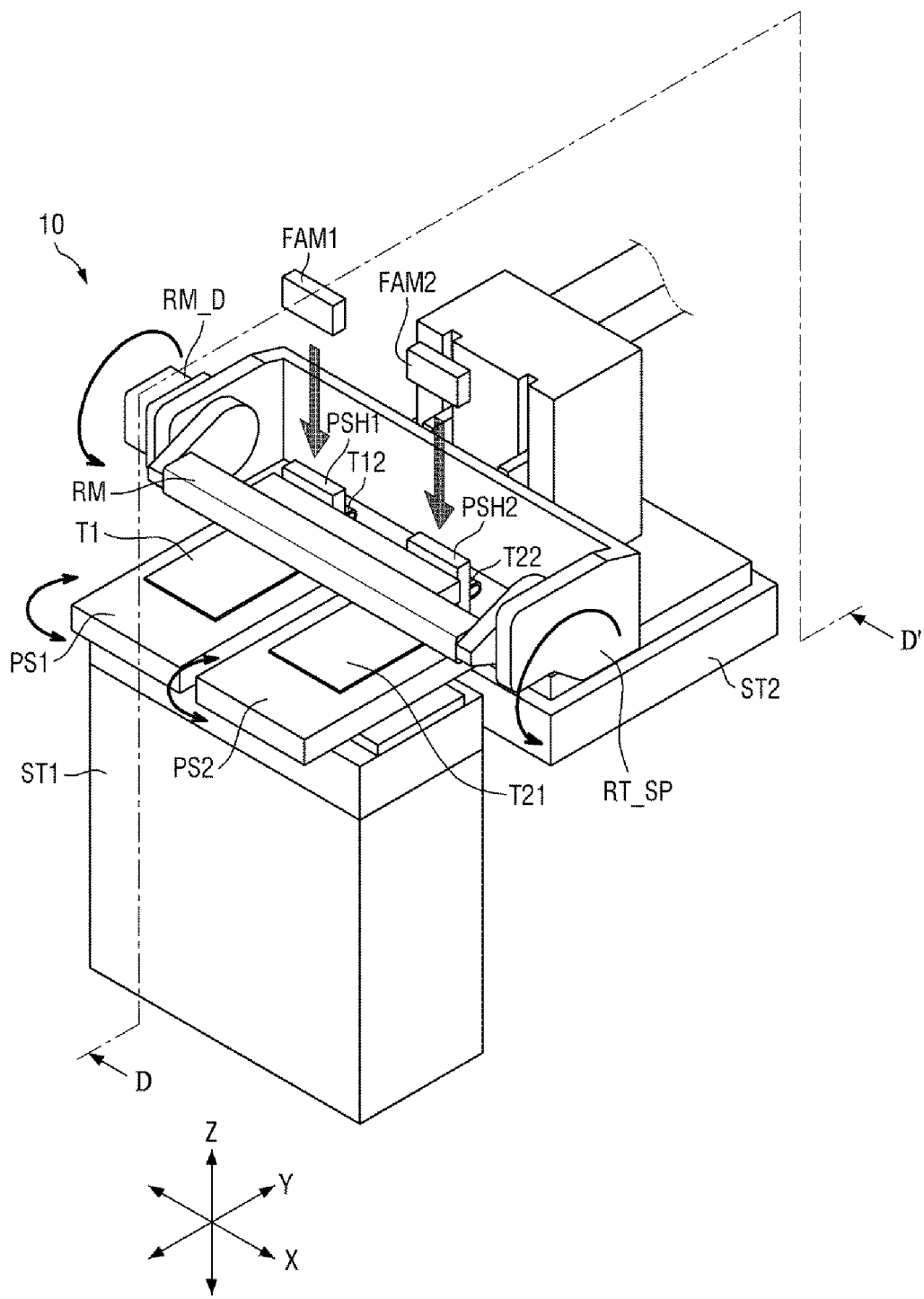
FIG. 8 illustrates an embodiment of the manufacturing apparatus in a state in which a target board is bent according to an embodiment.
Figure 9:
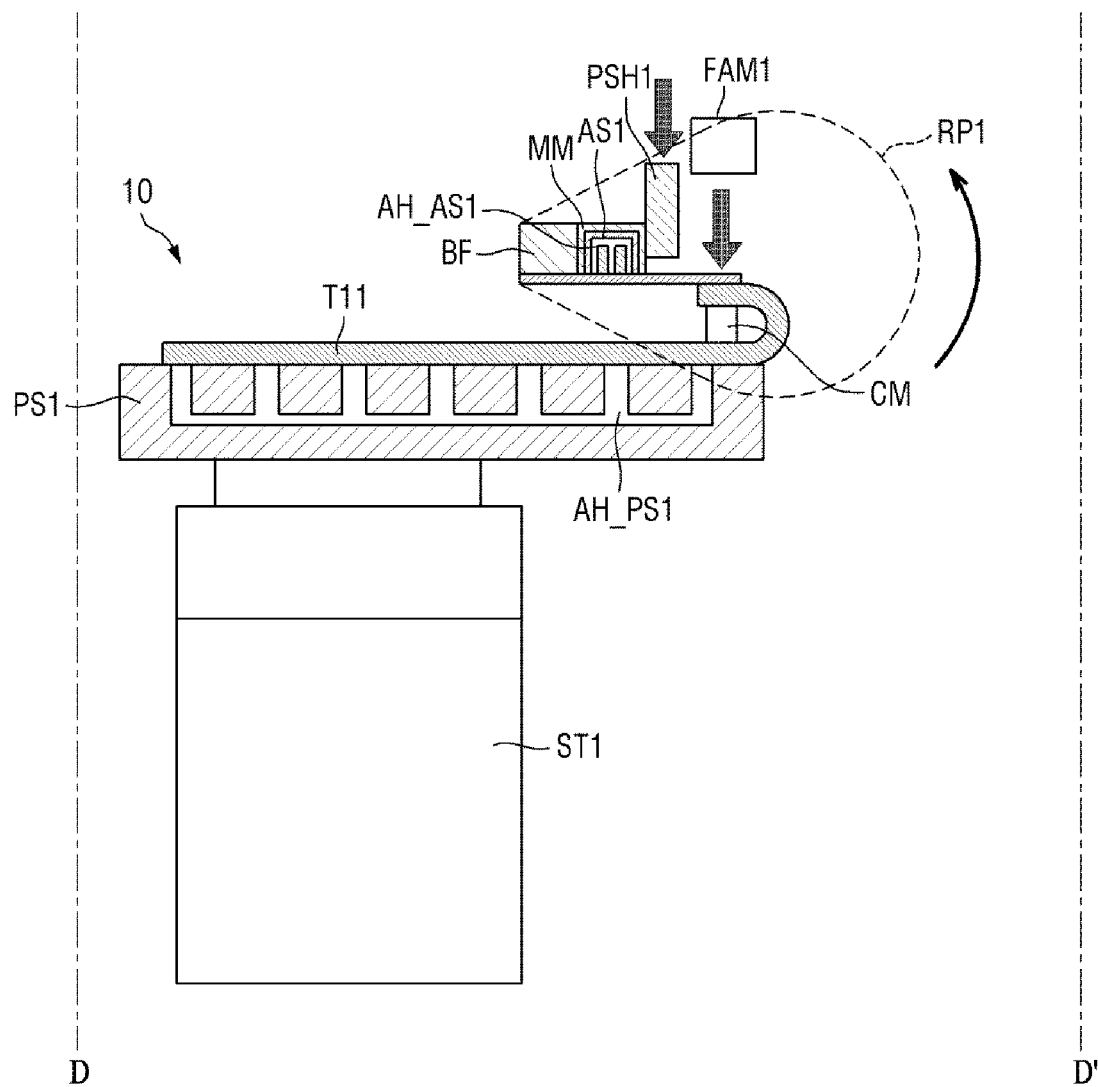
FIG. 9 illustrates a cross-sectional view taken along line D-D' of FIG. 8.

FIG. 8 is a perspective view of an embodiment of an apparatus for manufacturing a display device in a state in which the target board is bent. FIG. 9 is a cross-sectional view taken along line D-D' of FIG. 8.

Referring to FIGS. 4 to 9, the first target board T1 and the second target board T2 may be bent by the rotation of the rotating member RM. Bending of the first target board T1 and the second target board T2 may be performed after the first target board T1 and the second target board T2 are seated and/or aligned.

Referring to FIGS. 8 and 9, as described above, the rotating member RM may rotate about an arbitrary rotation axis extending in the first direction X. The rotation axis may pass through the rotating member RM or may be provided outside the rotating member RM. The rotation axis may be an actual shaft provided by a shaft or the like, or may be a virtual axis. When the rotating member RM rotates, the first arm module AR1 and the second arm module AR2 connected to the rotating member RM may also rotate together. Accordingly, when the rotating member RM rotates, the first target board T1 and the second target board T2 may be bent at substantially the same time.

As illustrated in FIG. 9, the rotating member RM may rotate toward a direction in which the first target board T1 and the second target board T2 are mounted, for example, may rotate counterclockwise. However, the present disclosure is limited thereto.

For example, the first adsorber AS1 adsorbs the first flexible circuit board T12 and rotates together with the rotating member RM when the rotating member RM rotates, and thus the first base board T11 can be bent. As illustrated in FIG. 9, for example, the first base board T11 may be bent to have a "U"-shaped cross section. When the first base board T11 is bent, the connection frame BF, the first adsorber AS1, and the first pusher PSH1 may overlap the first base board T11 in the thickness direction.

As illustrated in FIG. 9, when the first base board T11 is bent, the first flexible circuit board T12 and a portion of the first base board T11 connected to the first flexible circuit board T12 may overlap another portion of the first base board T11 in the thickness direction. For example, a portion of the first base board T11, another portion of the first base board T11, and a bent portion between the portion of the first base board T11 and another portion of the first base board T11 may be the sub region SR, the main region MR, and the bending region BR of FIGS. 1 and 2, respectively.

As illustrated in FIG. 9, the adhesive member CM may be interposed between the portion of the first base board T11 and another portion of the first base board T11. Similar to the first base board T11, the adhesive member CM may also be between a portion of the second base board T21 and another portion of the second base board T21.

Similarly, as in FIG. 8, the second base board T21 of the second target board T2 may also be bent in a manner substantially the same as or similar to the first base board T11 by the rotations of the second adsorber AS2 and the rotating member RM. When the second base board T21 is bent, the second base board T21 has a cross section having a "U" shape like the base board of FIG. 9, and the connection frame BF, the second adsorber AS2, and the second pusher PSH2 may overlap the second base board T21 in the thickness direction.

As described above, when the first base board T11 and the second base board T21 are bent, the first working table PS1 and/or the second working table PS2 may perform the alignment operation of moving and/or rotating in at least one direction. As described above, the alignment operation of the first working table PS1 and the alignment operation of the second working table PS2 may be performed independently of each other. When the first working table PS1 and/or the second working table PS2 performs the alignment operation, the first stage ST1 and/or the second stage ST2 may perform an additional alignment operation. However, the present disclosure is not limited thereto.

When the first base board T11 and the second base board T21 are bent, the first pusher PSH1 and the second pusher PSH2 may move toward the first flexible circuit board T12 and the second flexible circuit board T22, respectively. For example, as illustrated in FIGS. 8 and 9, the first pusher PSH1 and the second pusher PSH2 may be lowered in the third direction Z. The first pusher PSH1 and the second pusher PSH2 may be in close contact with the first flexible circuit board T12 and the second flexible circuit board T22, respectively, to prevent the first flexible circuit board T12 or the second flexible circuit board T22 from being warped.

The first pusher PSH1 and the second pusher PSH2 may be controlled at substantially the same time or individually. For example, depending on process conditions, the first pusher PSH1 and the second pusher PSH2 may be driven interdependently or independently of each other. For example, the first pusher PSH1 and the second pusher PSH2 may move by substantially the same distance or by different distances. For another example, the first pusher PSH1 and the second pusher PSH2 may be moved at substantially the same time or may be moved with a time difference. Each of the first pusher PSH1 and the second pusher PSH2 may be implemented by a linear guide including a servo motor or a cylinder configured to be stretchable. However, the present disclosure is not limited thereto.

Referring to FIGS. 8 and 9, when the first base board T11 and the second base board T21 are bent and/or aligned, a first pressing member FAM1 and a second pressing member FAM2 may be lowered toward the first target board T1 and the second target board T2, respectively. The first pressing member FAM1 may press a portion of the first base board T11 to another portion of the first base board T11, and second pressing member FAM2 may press a portion of the second base board T21 to another portion of second base board T21.

The portion of the first base board T11 may refer to a portion to which the first flexible circuit board T12 is connected and a portion adjacent thereto, and the portion of the second base board T21 may refer to a portion to which the second flexible circuit board T22 is connected and a portion adjacent thereto.

Referring to FIG. 9, the portion of the first base board T11 pressed by the first pressing member FAM1 may overlap the adhesive member CM of the first flexible circuit board T12. Likewise, the portion of the second base board T21 pressed by the second pressing member FAM2 may overlap the adhesive member CM.

After the pressing is completed, the first pressing member FAM1 and the second pressing member FAM2 move away from the first target board T1 or the second target board T2, and the first target board T1 and the second target board T2 may be unloaded from the first working table PS1 or the second working table PS2. For example, through the above processes, the display device 1 may be manufactured to include display panel 100, in which the bending region BR as illustrated in FIG. 2 is formed with the printed circuit board 300 connected to the display panel 100.

In FIGS. 4 to 9, two target boards, two working tables, and two arm modules are illustrated. However, the number of target boards, the number of working tables, and the number of arm modules are not limited thereto. The manufacturing apparatus 10 of the display device may include three or more working tables and three or more arm modules.

Only one first target board T1 may be mounted on the first working table PS1 and bent, or only one second target board T2 may be mounted on the second working table PS2 and bent. In this case, only one of the first arm module AR1 and the second arm module AR2 may be operated. For example, when only the first target board T1 is mounted, only the first adsorber AS1 and the first pusher PSH1 may be operated. When only the second target board T2 is mounted, only the second adsorber AS2 and the second pusher PSH2 may be operated.

Figure 10:
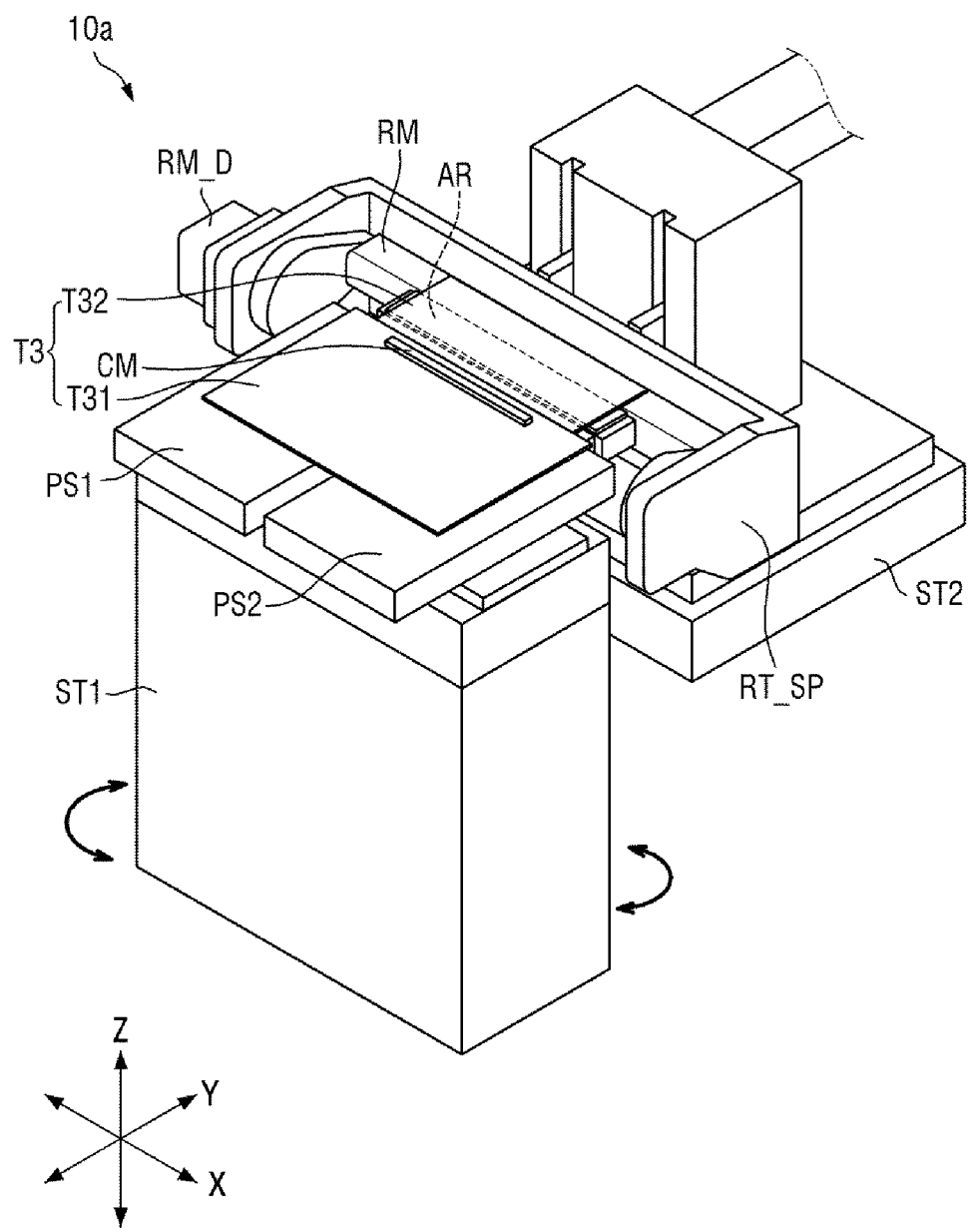
FIG. 10 illustrates an embodiment of an apparatus for manufacturing a display device.
Figure 11:
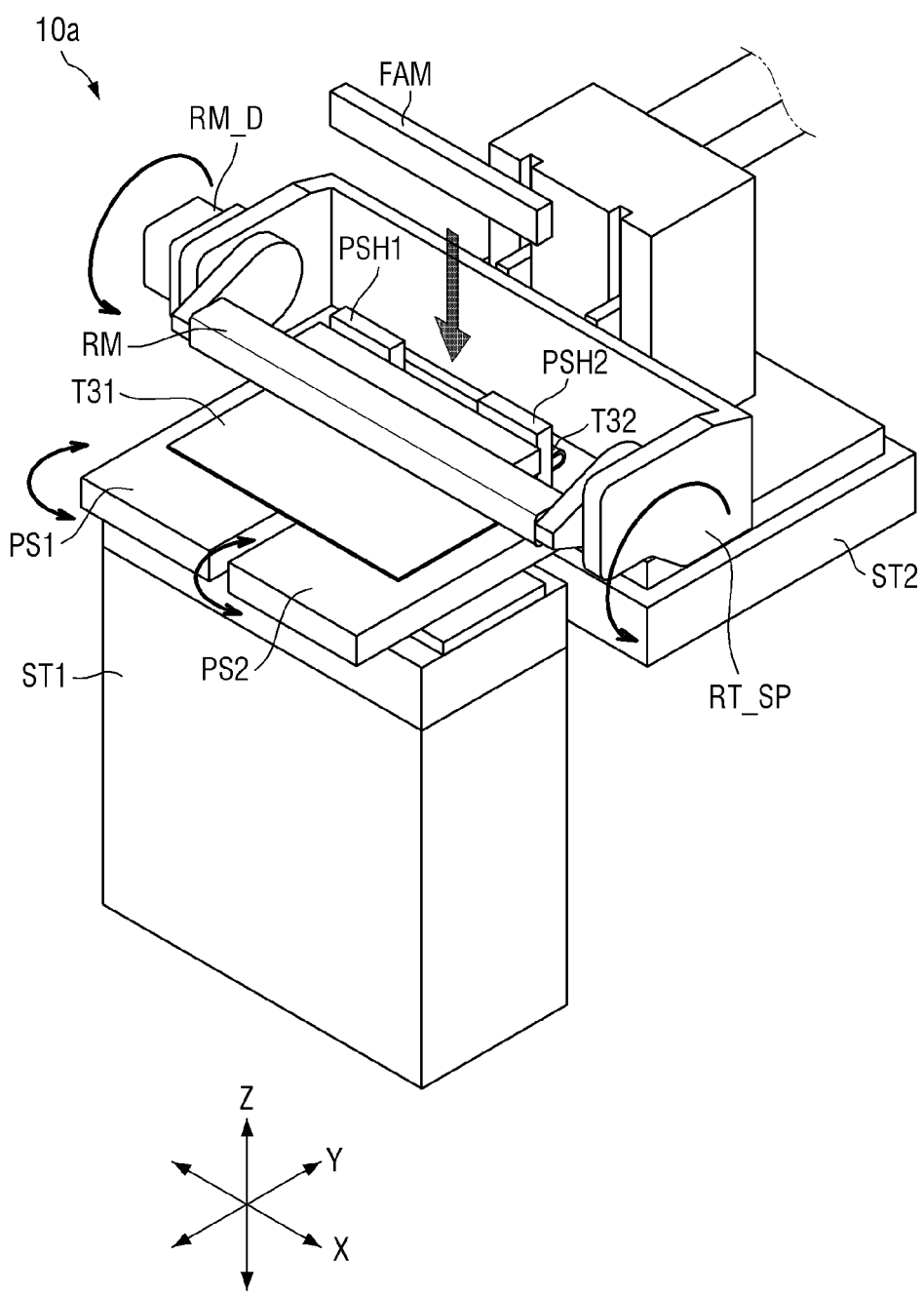
FIG. 11 illustrates an embodiment of an apparatus for manufacturing a display device in a state in which a target board is bent.

FIG. 10 is a perspective view of an embodiment of an apparatus for manufacturing a display device. FIG. 11 is a perspective view of the apparatus of FIG. 10 in a state in which a target board is bent.

Referring to FIGS. 10 and 11, unlike the embodiment of FIGS. 4 to 9, only one third target board T3 may be mounted on the first working table PS1 and the second working table PS2. The third target board T3 may have a larger size than the first target board T1 and the second target board T2 of FIGS. 4 to 9. The third target board T3 may be bent and pressed in a manner substantially the same as or similar to the first target board T1 and/or the second target board T2 of FIGS. 4 to 9.

The third target board T3 may include a third base board T31 and a third flexible circuit board T32. For example, the third base board T31 and the third flexible circuit board T32 may be the display panel 100 and the printed circuit board 300 of FIGS. 1 to 3, respectively. However, the present disclosure is not limited thereto.

As illustrated in FIGS. 10 and 11, the third base board T31 may be disposed over the first working table PS1 and the second working table PS2. The third flexible circuit board T32 may be disposed on the first arm module AR1 and the second arm module AR2.

Referring to FIGS. 9 and 11, the third flexible circuit board T32 may be adsorbed by the first adsorber AS1 and the second adsorber AS2. When the rotating member RM rotates, the third base board T31 may be bent to have a "U"-shaped cross section, similar to the first base board T11 illustrated in FIG. 9.

When the third base board T31 is bent, similar to the embodiment of FIG. 9, the first pusher PSH1 and the second pusher PSH2 may be lowered toward the third flexible circuit board T32. The first pusher PSH1 and the second pusher PSH2 may be in close contact (e.g., to within a predetermined distance) with the third flexible circuit board T32 to prevent the third flexible circuit board T32 from being warped.

When the third base board T31 is bent, similar to the embodiment of FIG. 9, a pressing member FAM is lowered toward the third target board T3, and thus a portion of the third target board T3 can be pressed to another portion of the third target board T3. Although one pressing member FAM is illustrated in FIG. 11, the number of pressing members FAM is not limited thereto.

As described above, the first adsorber AS1 and the second adsorber AS2 may be controlled at substantially the same time or individually. Likewise, the first pusher PSH1 and the second pusher PSH2 may be controlled at substantially the same time individually.

Before and after the third target board T3 is mounted and/or the third target board T3 (third base board T31) is bent, the first stage ST1 and/or the second stage ST2 may perform an alignment operation of moving and/or rotating in at least one direction. Accordingly, the position of the third target board T3 may be appropriately adjusted to a position suitable for bending and/or bonding. During the alignment operation of the first stage ST1, the first working table PS1 and the second working table PS2 connected to the first stage ST1 may be moved and/or rotated integrally.

For example, in a first mode in which the first target board T1 and the second target board T2 are mounted on the first working table PS1 and the second working table PS2, respectively, when the first target board T1 and the second target board T2 are aligned, the first working table PS1 and/or the second working table PS2 may move and/or rotate. Moreover, in a second mode in which the third target board T3 is mounted over the first working table PS1 and the second working table PS2, when the first target board T1 and the second target board T2 are aligned, the first stage ST1 and/or the second stage ST2 may move and/or rotate. The embodiment of FIGS. 10 and 11 may be substantially the same as or similar to the embodiment of FIGS. 4 to 9, except for the third target board T3.

Figure 12:
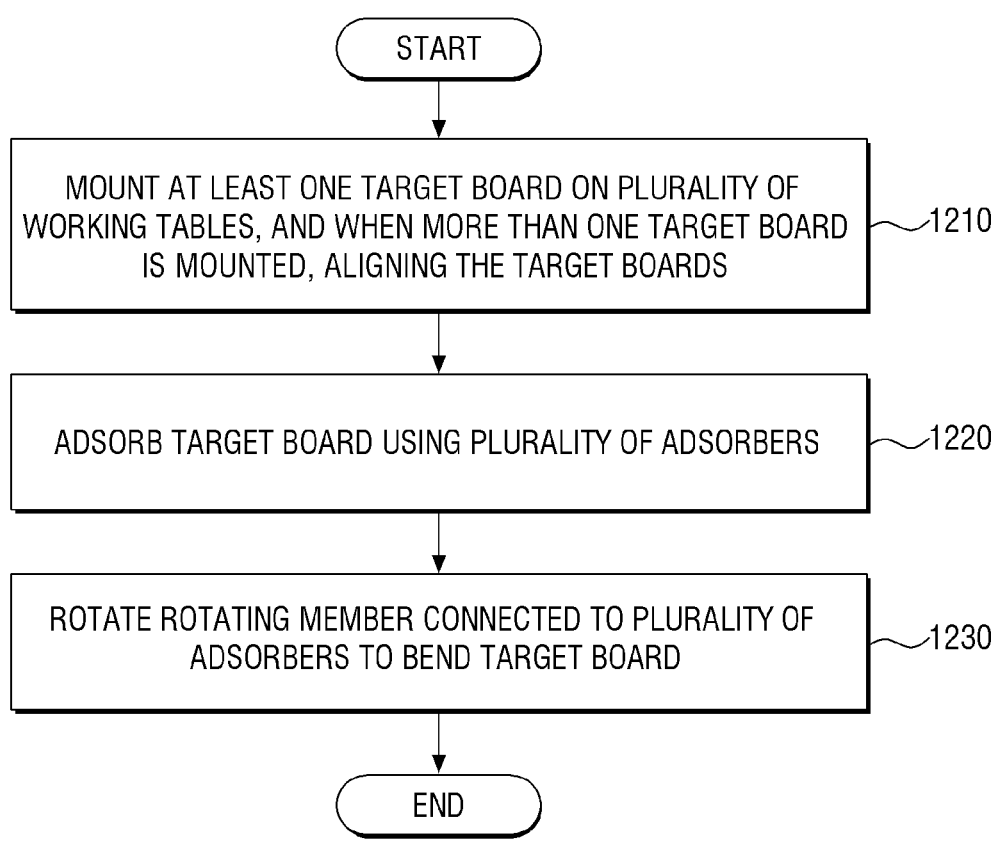
FIG. 12 illustrates an embodiment of a method of manufacturing a display device.

FIG. 12 is a flowchart illustrating an embodiment of a method for manufacturing a display device. For illustration purposes, the display device is described as corresponding to display device 1 of FIGS. 1 to 3, and the method may be performed by the display device manufacturing apparatuses 10 and 10a of FIGS. 4 to 11. However, the display device and manufacturing apparatus may be different than those indicated above in other embodiments.

Referring to FIG. 12, the method may include an operation of mounting at least one target board on a plurality of working tables PS1 and PS2 (1210), an operation of adsorbing the target board using a plurality of adsorbers AS1 and AS1 (1220), and an operation of bending the target board by rotating a rotating member RM connected to the plurality of adsorbers AS1 and AS1 (1230). The at least one target board may be at least one of the first target board T1, the second target board T2, and the third target board T3 of FIGS. 4 to 11.

At 1210, the operation of mounting at least one target board on the plurality of working tables PS1 and PS2 may include an operation of mounting one target board over the plurality of working tables PS1 and PS2. The method may further include an operation of aligning the target board, which may include at least one of an operation of individually moving the plurality of working tables PS1 and PS2 or an operation of individually rotating the plurality of working tables PS1 and PS2. The display device manufacturing method is not limited to the above example, and at least some of the operations may be omitted, or at least one other operation may be further included with reference to other descriptions of the present specification.

Referring to FIG. 5, the operation of mounting at least one target board on the plurality of working tables PS1 and PS2 may include an operation of mounting a plurality of target boards for each of the plurality of working tables PS1 and PS2. For example, first, the first target board T1 and the second target board T2 may be prepared. For example, the first target board T1 and the second target board T2 may be transferred from the outside by a transfer unit such as a transfer robot. As described above, the transferred first target board T1 and second target board T2 may be mounted on the first working table PS1 and the second working table PS2, respectively.

Referring to FIG. 5, the display device manufacturing method may further include an operation of aligning the target board, and the operation of aligning the target board may include at least one of an operation of individually moving the plurality of working tables PS1 and PS2 or an operation of individually rotating the plurality of working tables PS1 and PS2. For example, after the mounting of the first target board T1 and the second target board T2 is completed, the first working table PS1 and the second working table PS2 may perform the alignment operation. Accordingly, the first target board T1 and the second target board T2 may be aligned to appropriate positions for bending.

After alignment of the first target board T1 and second target board T2 is completed, the first arm module AR1 may adsorb the first flexible circuit board T12, and the second arm module AR2 may adsorb the second flexible circuit board T22. In one embodiment, when the first target board T1 and the second target board T2 are mounted, the first arm module AR1 and the second arm module AR2 may move to be spaced apart from the first flexible circuit board T12 or the second flexible circuit board T22.

Then, when the first flexible circuit board T12 or the second flexible circuit board T22 is adsorbed at 1220, the first arm module AR1 and the second arm module AR2 may move toward the first flexible circuit board T12 or the second flexible circuit board T22 and come into close proximity with the first flexible circuit board T12 or the second flexible circuit board T22. However, the present disclosure is not limited thereto.

Referring to FIGS. 8 and 9, the operation of bending the target board by rotating the rotating member RM connected to the plurality of adsorbers AS1 and AS1 at 1230 may include an operation of bending the plurality of target boards at substantially the same time. For example, after alignment and adsorption of the first target board T1 and the second target board T2 are completed, the rotating member RM may rotate so that the first target board T1 and the second target board T2 are bent at 1230.

After the first target board T1 and the second target board T2 are bent, the first working table PS1 and the second working table PS2 may perform the alignment operation again. Accordingly, the first target board T1 and the second target board T2 may be aligned to appropriate positions for pressing.

After the alignment of the first target board T1 and the second target board T2 is completed, the first pressing member FAM1 and the second pressing member FAM2 may be respectively lowered toward the first target board T1 and the second target board T2 to press the first target board T1 and the second target board T2.

After the pressing of the first target board T1 and the second target board T2 is completed, the first pressing member FAM1 and the second pressing member FAM2 may be raised, and the first target board T1 and the second target board T2 may be unloaded from the first working table PS1 and the second working table PS2, respectively.

Referring to FIGS. 10 and 11, the operation of mounting at least one target board on the plurality of working tables PS1 and PS2 may include an operation of mounting one target board over the plurality of working tables PS1 and PS2. For example, only one third target board T3 may be mounted on the first working table PS1 and the second working table PS2. As described above, the third target board T3 may be bent and pressed in a manner substantially the same as or similar to the first target board T1 and the second target board T2 by rotation of the rotating member RM.

However, when the third target board T3 is aligned, the first working table PS1 and the second working table PS2 may not perform individual alignment operations, and the first stage ST1 may perform the alignment operation so that the first working table PS1 and the second working table PS2, and the third target board T3 disposed thereon are integrally moved and/or rotated. In this case, the second stage ST2 may also perform the alignment operation so that the rotating member RM, the first arm module AR1, and the second arm module AR2 are integrally moved and/or rotated.

One first target board T1 may be mounted on the first working table PS1 or the second working table PS2. In this case, in the first working table PS1, the second working table PS2, the first arm module AR1, and the second arm module AR2, only the first working table PS1 and the first arm module AR1 may be driven or only the second working table PS2 and the second arm module AR2 may be driven.

In accordance with one or more embodiments of an apparatus and method for manufacturing a display device, one or more display panels may be selectively mounted a plurality of working tables for bending and bonding the display panel(s). Accordingly, it is possible to reduce process time, improve equipment efficiency and flexibly respond to design changes. Also, process time can be reduced and equipment efficiency can be improved.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation. The embodiments may be combined to form additional embodiments.

What is claimed is:

1. A method of manufacturing a display device that is operatively associated with an apparatus, the method comprising:
    mounting a plurality of target boards directly on a plurality of working tables of the apparatus, respectively;
    adsorbing the plurality of target boards using a plurality of adsorbers of the apparatus, respectively; and
    rotating a rotator connected to the plurality of adsorbers of the apparatus to simultaneously bend the plurality of target boards at a same time.

2. The method of claim 1, wherein the mounting of the plurality of target boards further comprises:
    aligning the target boards on respective ones of the plurality of working tables,
    wherein the aligning of the target boards comprise individually moving the plurality of working tables or individually rotating the plurality of working tables.

* * * * *